United States Patent [19]
Gresko

[11] Patent Number: 6,054,905
[45] Date of Patent: Apr. 25, 2000

[54] USER CONFIGURABLE CATV POWER INSERTER

[75] Inventor: Richard Gresko, Huntingdon Valley, Pa.

[73] Assignee: General Instrument Coporation, Horsham, Pa.

[21] Appl. No.: 09/010,241

[22] Filed: Jan. 21, 1998

[51] Int. Cl.[7] .................................................. H03H 7/48
[52] U.S. Cl. ........................ 333/100; 333/167; 455/3.3
[58] Field of Search ................................. 333/100, 167, 333/175; 455/3.3; 379/413

[56] References Cited

U.S. PATENT DOCUMENTS

| | | | |
|---|---|---|---|
| 3,943,447 | 3/1976 | Shomo, III .............................. | 325/308 |
| 5,216,569 | 6/1993 | Brookhiser .............................. | 361/107 |
| 5,381,050 | 1/1995 | Siclari et al. ........................... | 307/112 |

*Primary Examiner*—Justin P. Bettendorf
*Attorney, Agent, or Firm*—Volpe and Koenig, P.C.

[57] ABSTRACT

A CATV power inserter is presented allowing multiple power sourcing configurations while providing isolation between the RF signal and alternating current insertion ports. The power inserter achieves the variety of configurations by using a four point terminal block having uniform dimensions allowing simple connecting bars and fusing or current limiting options to be interchanged thereby increasing economy and performance.

13 Claims, 7 Drawing Sheets

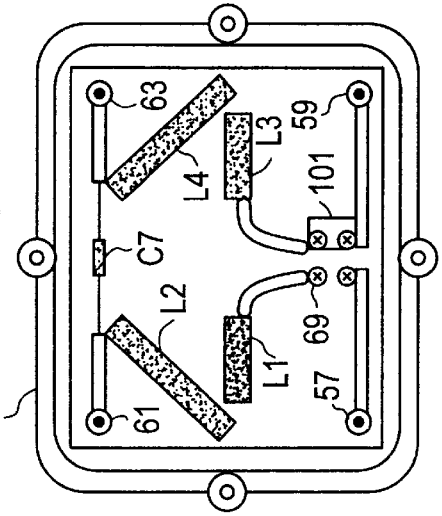
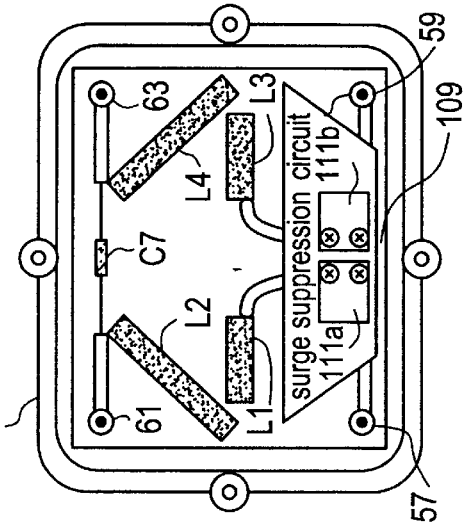
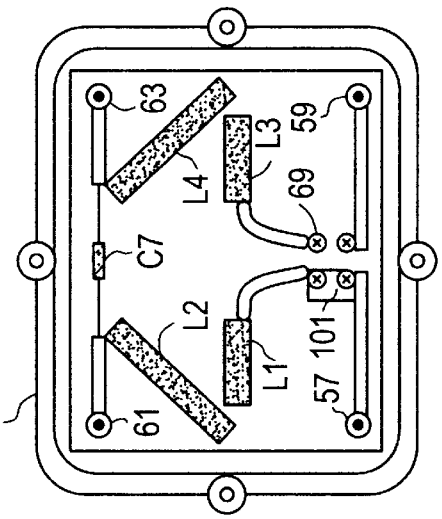
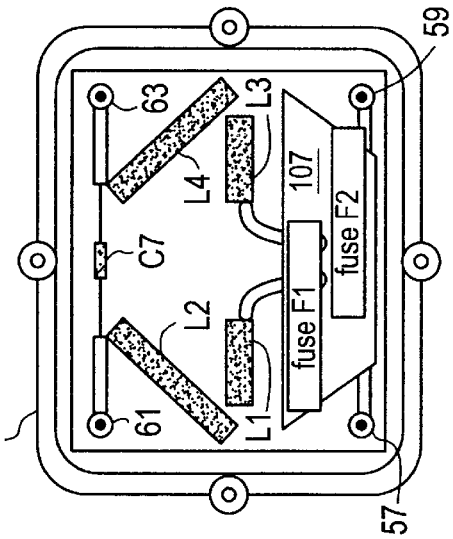
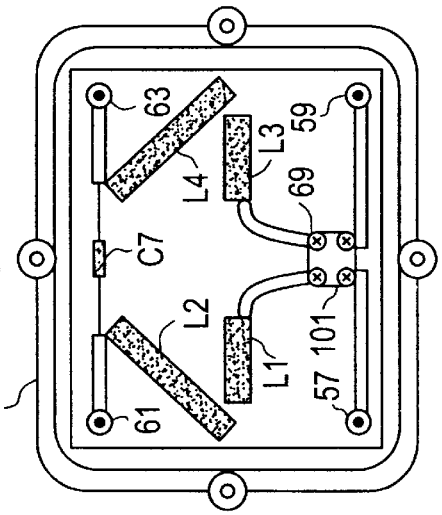
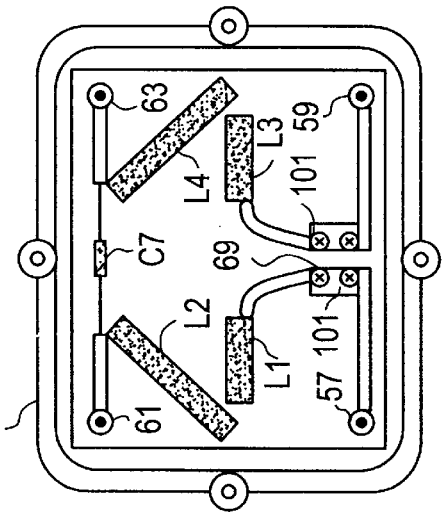

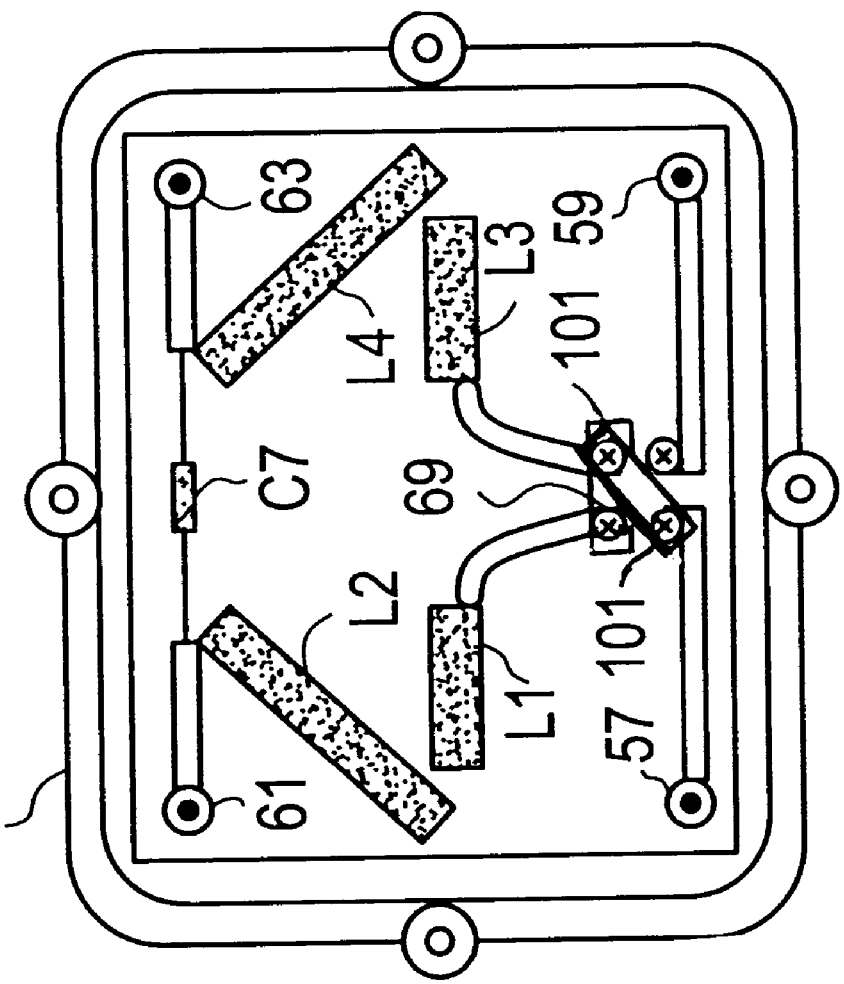

USER CONFIGURABLE CATV POWER INSERTER

This is a division of application Ser. No. 08/604,219, filed Feb. 20, 1996 now U.S. Pat. No. 5,903,046 incorporated herein by reference.

BACKGROUND OF THE INVENTION

1. Field of the Invention

This invention relates generally to cable television communication system distribution components. More particularly, the invention relates to a power inserter having dual power supply ports that can be internally configured to source power directionally or to use independent mains power supplies for dedicated directions in a CATV distribution system.

2. Description of the Prior Art

Cable television (CATV) services are provided to customers through a transmission network that typically includes a trunk system transporting the plurality of CATV services from a cable headend to smaller branches and then onto individual subscriber drops. The transmission medium for the branch and subscriber drops is usually coaxial cable. To provide for the transmission of the CATV services, the transmission network includes cable taps, cable splitters, line amplifiers and other miscellaneous equipment to distribute the CATV services.

A typical CATV cable plant is designed with unity gain from the headend to each subscriber terminal. Signal losses and gains throughout the trunk, branch lines and subscriber drops are noted and adjusted to maintain unity gain throughout. However, many of the aforementioned devices that distribute the cable services burden the system. As the CATV signal proceeds throughout the distribution system, the attenuation of the coaxial cable and the insertion loss of passive devices reduce the signal to less than unity thereby requiring periodic amplification. Line amplifiers are installed and adjusted accordingly to maintain unity gain.

Line amplifiers are usually suspended by the signal carrying coaxial cable support strand and are powered from the signal carrying coax cable. The usual method of distributing the mains power supply to each line amplifier is by impressing or inserting the alternating current on the coaxial cable via a CATV power inserter.

A power inserter consists of a low-pass filter designed for 60 cycle, 60 Vac and a band rejection filter for the RF signal components present on the coaxial cable. The power inserter is housed in a weather and RFI proof enclosure and is also suspended on the cable strand. At a line amplifier, filters separate the CATV RF signal from the impressed 60 Vac. The RF signal is amplified with the ac component providing the power source.

Power is usually supplied to a power inserter by a ferroresonant transformer located on a nearby telephone pole. The primary side of the ferroresonant transformer is connected to a single phase power supply from the local utility. Ferroresonant transformers provide isolation, regulation, and if necessary, reduction from the mains power supply.

The power inserter can provide power for several line amplifiers. Shown in FIG. 1 is a simplified branch 15 of a CATV distribution system. A prior art power inserter 17 is shown sourcing four line amplifiers 19 on either side of the power inserter 17. A ferroresonant transformer 21 is shown sourcing the power inserter 17. Both power and signal flow are bidirectional within the coaxial cable 23.

A schematic for the prior art power inserter 17 is shown in FIG. 2. The power inserter 17 has a single power jack or port 25, and first 27 and second 29 RF jacks or ports. The alternating or direct current 31 is filtered using a first 2-pole (2nd order) low-pass filter comprised of a first inductor 33 coupled to first 35 and second 37 parallel capacitors. The current flow for both coaxial cable directions is limited with first 39 and second 41 fuses to their respective first 27 and second 29 RF jacks. Power insertion may be directional in dependence upon one or both fuses being installed. The output from the first fuse 39 is low-pass filtered through a second 2-pole low-pass filter 47 and coupled to the signal conductor of the first RF jack 27. The output from the second fuse 41 is low-pass filtered through a third 2-pole low-pass filter 49 and coupled to the signal conductor of the second RF jack 29. To allow the RF signal to pass freely between the first 27 and second 29 RF jacks, a sixth capacitor 51 forms a high-pass filter between the RF terminals blocking the low frequency current thereby giving direction to power flow.

A variation of the single source power inserter 19 is shown in FIGS. 3 and 4. A dual alternating or direct current source power inserter 53 is shown having two isolated ac terminals (depending upon the configuration of an internal jumper 54) each sourcing a dedicated RF terminal. However, the prior art dual source power inserter 53 has limitations when configuring the power inserter 53 concerning isolation between RF terminals and power ports.

In order to increase the number of sourcing options available in one cable television power inserter, it is desirable to have a low cost device that can provide common or isolated directional power insertion or distribution.

SUMMARY OF THE INVENTION

A CATV power inserter is presented that allows for a plurality of power sourcing options while providing superior isolation between the RF signal and the power supply insertion points. The power inserter achieves the variety of configurations by using a four point terminal block having uniform, compatible dimensions allowing simple connecting bars, fusing and current limiting options to be quickly interchanged thereby increasing economy.

Accordingly, it is an object of the present invention to provide a CATV power inserter having dual power supply ports.

It is a further object of the invention to provide a power inserter allowing multiple configurations for single or dual power supplies and the capability of easily adding current limiting functions.

Other objects and advantages of the power inserter will become apparent to those skilled in the art after reading the detailed description of the preferred embodiment.

BRIEF DESCRIPTION OF THE DRAWINGS

FIG. 6 is an alternative configuration of the present invention having a common high current ac/dc port.

FIG. 7 is an alternative configuration of the present invention having a single, directional ac/dc port.

FIG. 8 is an alternative configuration of the present invention having a single, directional ac/dc port.

FIG. 9 is an alternative configuration of the present invention having dual isolated directional ac/dc ports.

FIG. 9A is an alternative configuration of the present invention having a common ac/dc port.

FIG. 10 is an alternative configuration of the present invention having dual isolated, directional ac/dc ports with current limiting.

FIG. 11 is an alternative configuration of the present invention having dual isolated, directional ac/dc ports with active surge suppression circuitry.

DESCRIPTION OF THE PREFERRED EMBODIMENTS

Figure 1:
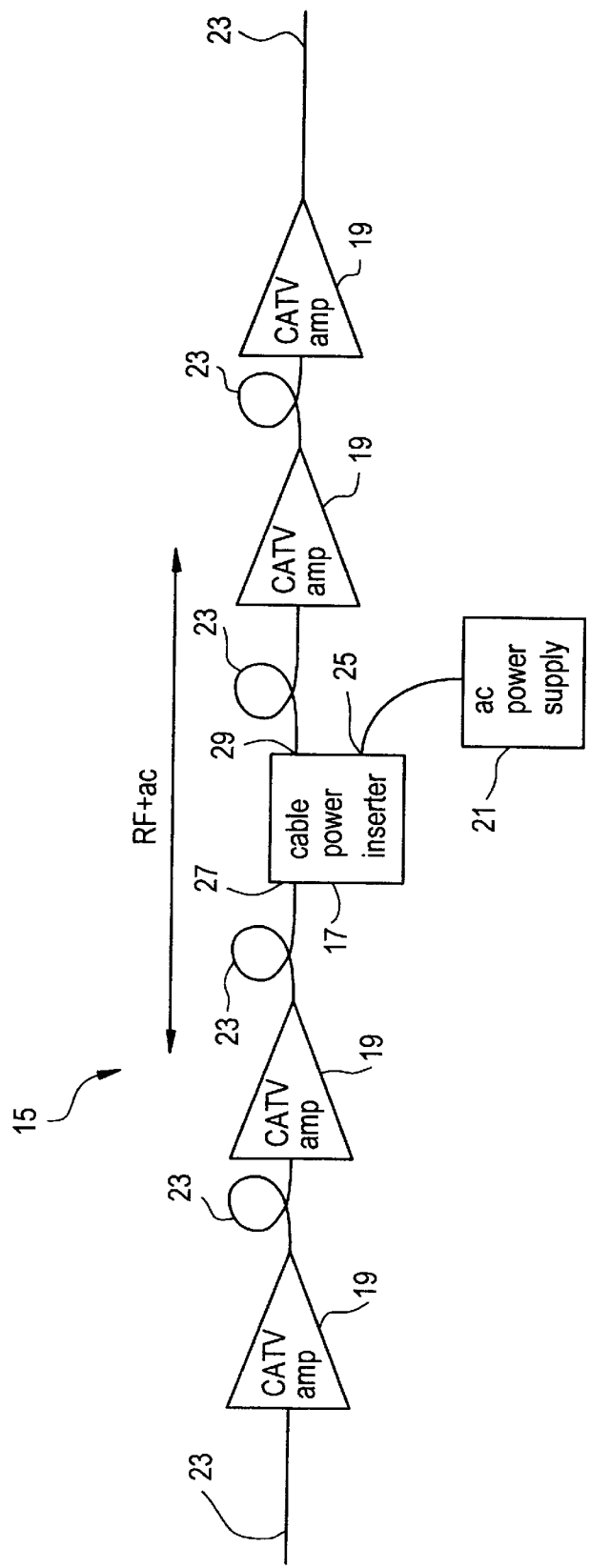
FIG. 1 is a block diagram of a prior art CATV distribution branch with a single ac/dc port power inserter and line amplifiers.
Figure 2:
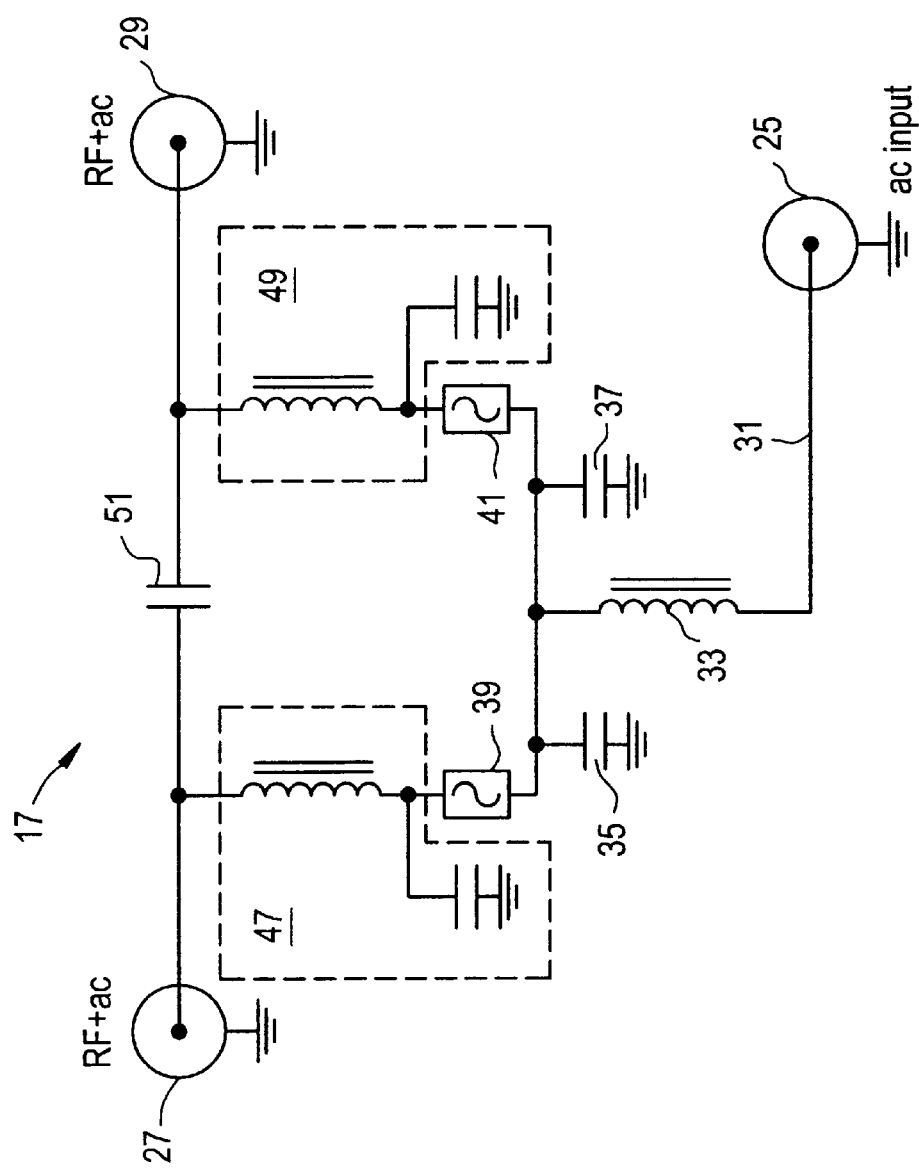
FIG. 2 is a prior art schematic of the single ac/dc port power inserter.
Figure 3:
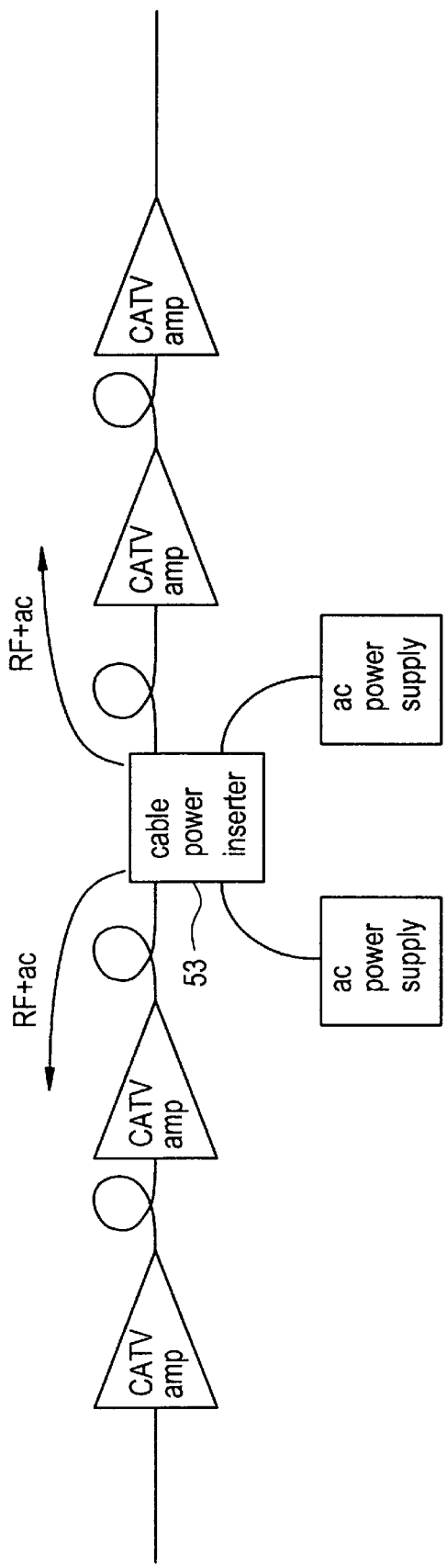
FIG. 3 is a block diagram of a prior art CATV distribution branch with a dual ac/dc port power inserter and line amplifiers.
Figure 4:
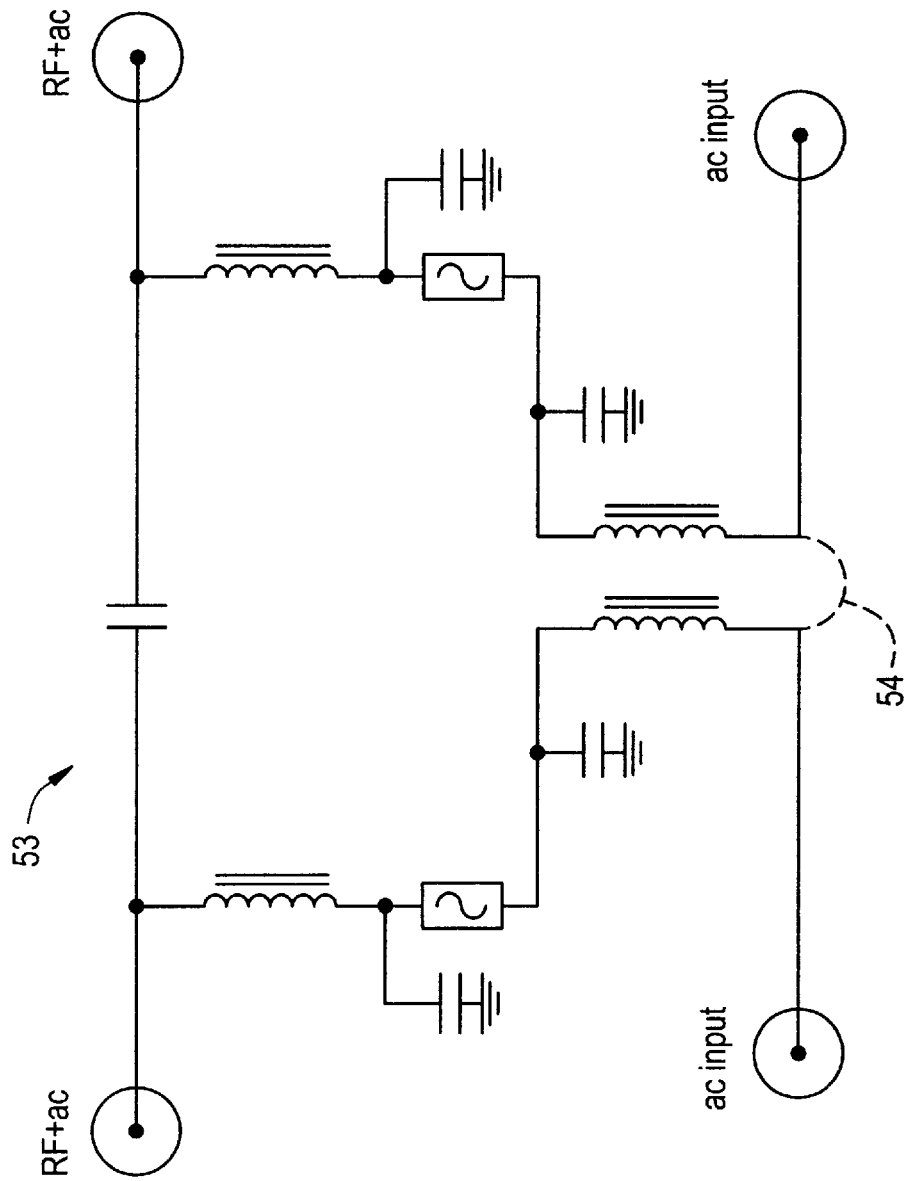
FIG. 4 is a prior art schematic of the dual ac/dc port power inserter.

The preferred embodiment will be described with reference to the drawing figures where like numerals represent like elements throughout.

Figure 5:
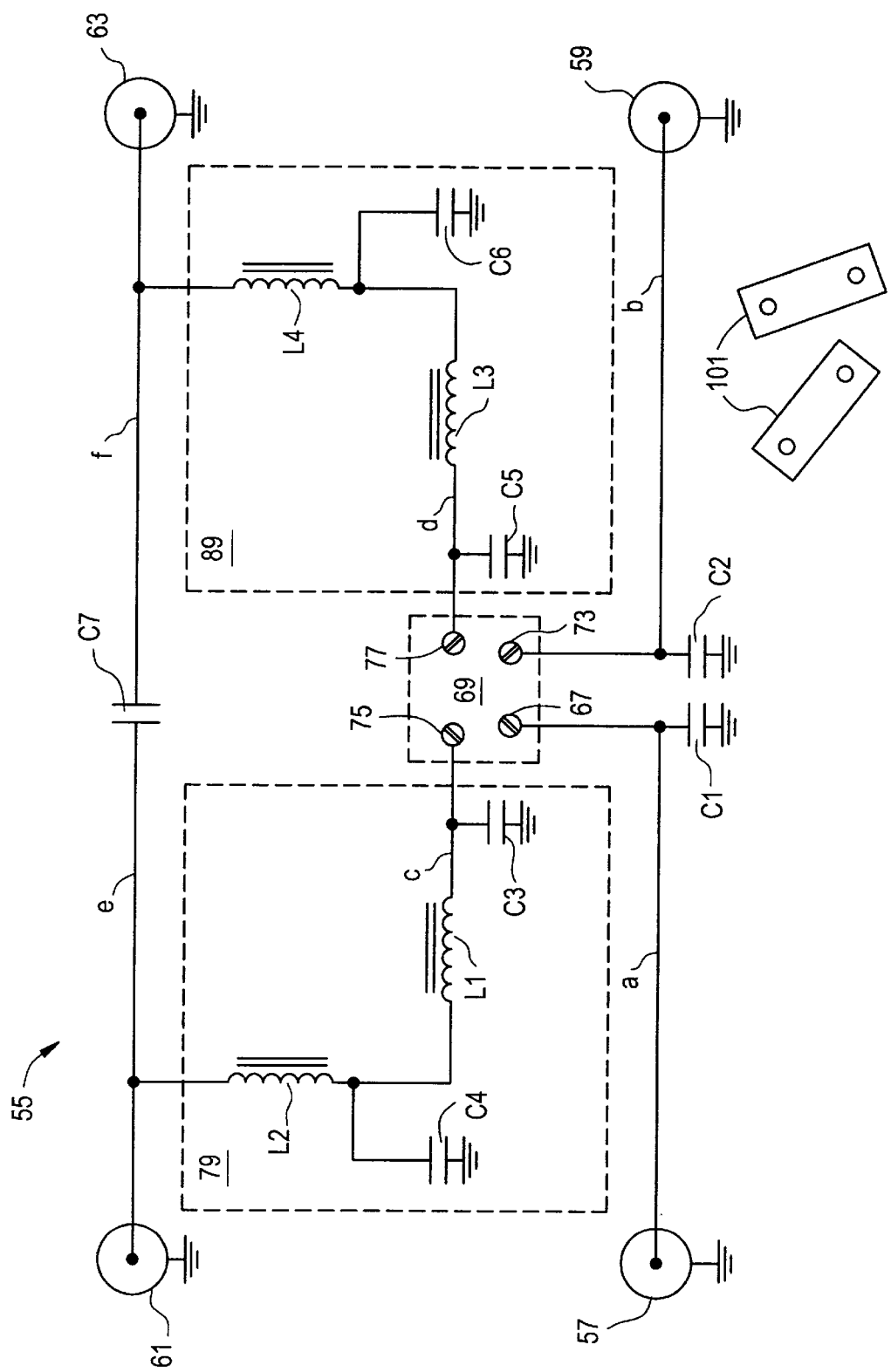
FIG. 5 is a CATV power inserter embodying the present invention.

With reference to FIG. 5, a power inserter 55 embodying the present invention is shown. The power inserter 55 includes four external connections; first 57 and second 59 ac/dc jacks or ports and first 61 and second 63 RF signal jacks or ports. The individual components of the power inserter 55 are assembled on a printed circuit board (PCB) which is housed in a lightweight diecast aluminum alloy housing with a rotatable face plate providing strand or pedestal mounting and RFI shielding. The power inserter 55 includes dual ac/dc ports, distribution, and coupling to the RF signal jacks.

The first ac/dc jack 57 is shunted with a first capacitor C1 forming node a. Node a is also coupled to a first terminal 67 of a configurable terminal block 69. The second ac/dc jack 59 is shunted with a second capacitor C2 forming node b. Node b is coupled to a second terminal 73 of the configurable terminal block 69. The configurable terminal block 69 includes third 75 and fourth 77 terminals forming nodes c and d respectively.

Node c is coupled to a first 79 4-pole low-pass filter including third C3 and fourth C4 capacitors and first L1 and second L2 inductors. The second inductor L2 is coupled to the signal carrying conductor of the first 61 RF jack forming node e.

Node d is coupled to a second 89 4-pole low-pass filter including fifth C5 and sixth C6 capacitors and third L3 and fourth L4 inductors. The fourth inductor L4 is coupled to the signal carrying conductor of the second 63 RF jack forming node f.

Coupled between the signal carrying conductors of the first 61 and second 63 RF jacks (Nodes e and f) is a seventh C7 capacitor for passing high frequencies.

The individual component values for the preferred embodiment are shown in Table 1.

TABLE 1

| COMPONENT | SPECIFICATIONS | COMPONENT | SPECIFICATION |
|---|---|---|---|
| C1 | .01 µF, 1000 Vac | L1 | Power passing choke |
| C2 | .01 µF, 1000 Vac | L2 | Power passing choke |

TABLE 1-continued

| COMPONENT | SPECIFICATIONS | COMPONENT | SPECIFICATION |
|---|---|---|---|
| C3 | .01 µF, 1000 Vac | L3 | Power passing choke |
| C4 | .047 µF, 1000 Vac | L4 | Power passing choke |
| C5 | .01 µF, 1000 Vac | | |
| C6 | .047 µF, 1000 Vac | | |
| C7 | 500 pF, 1000 Vac | | |

A discussion of passive filters using inductors and capacitors of various orders (poles) is beyond the scope of this specification and is well understood by those skilled in the art of electronics.

Referencing the schematic shown in FIG. 5 one can see that by coupling individual connecting bars 101 between the terminals 67, 73, 75, and 77 of the configurable terminal block 69, various power supply combinations dictating direction can be easily achieved by the present invention. Power can be directed through the various nodes (nodes a–f) to either signal jack 61, 63. As one skilled in this art realizes, the present invention can also act as a power source or tap since the current flow is bidirectional.

Referencing FIGS. 6, 7 and 8, configurations of the configurable terminal block 69 that allows either the first 57 or second 59 ac/dc jacks to apply power to the power inserter 55 in dedicated directions at the physical location where the power inserter 55 is placed on the coaxial cable 23 are shown. FIGS. 7 and 8 show configurations where power insertion is directional as to the configuration of the terminal block 69 and whether power is applied to the first 57 or second 59 ac/dc jacks. The ac/dc jack not coupled is open-circuited. FIG. 7 shows the connecting bar 101 placed to allow current to flow from the first ac/dc jack 57 to the first RF jack or port 61. FIG. 8 shows the connecting bar 101 placed to allow current to flow from the second ac/dc jack 59 to the second RF jack or port 63.

The configuration shown in FIG. 9 allows independent mains power to be applied in separate, dedicated cable directions at the location of the power inserter 55. In this configuration, two connecting bars 101 are used isolating both the first 57 and second 59 ac/dc jacks from each other and allowing separate directional power insertion paths with different current requirements through to their respective RF jacks. The configuration of the connecting bars 101 shown in FIG. 9A permits the first ac/dc jack 57 to apply a power through both RF jacks 61, 63.

FIGS. 10 and 11 show optional circuit boards 107, 109 that have four terminals aligned to couple with the configurable terminal block 69. FIG. 10 shows a simple fusing arrangement that includes first F1 and second F2 fuses that provide protection to the mains power supply wiring for the first 57 and second 59 ac/dc jacks. The first fuse F1 couples the first 67 and fourth 77 terminals of the configurable terminal block 69 (not shown). The second fuse F2 couples the second 73 and third 77 terminals of the configurable terminal block 69 (not shown). As can be appreciated by one skilled in this art, the fuse values may vary in consideration of the upstream mains sourcing capability and wire ampacity. The present invention 55 can be configured for varying numbers of line amplifiers located on either side of the power insertion point. A similar function is shown in FIG. 11 with dual active surge suppression. The first current limiting circuit 111a couples the first 67 and fourth 75 terminals of the configurable terminal block 69 (not shown). The second current limiting circuit 111b couples the second 73 and third 77 terminals of the configurable terminal block 69 (not shown). In this configuration, active current monitoring is employed for each path of power insertion. This configuration limits the range of the current draw to a predetermined value.

While the present invention has described in terms of the preferred embodiment, other variations which are within the scope of the invention as outlined in the claims below will be apparent to those skilled in the art.

What is claimed is:

1. A user configurable passive component for supplying an alternating or direct current onto a coaxial cable having first and second signal ports and first and second current ports comprising:

a configurable terminal block having four terminals;

the first current port being coupled to a first terminal of said configurable terminal block forming a node a;

the second current port being coupled to a second terminal of said terminal block forming a node b;

a third terminal of said configurable terminal block defining a node c, the first signal port defining a node e, and a first low-frequency passing circuit coupled between nodes c and e;

a fourth terminal of said configurable terminal block defining a node d, the second signal port defining a node f, and a second low-frequency passing circuit coupled between nodes d and f; a high-frequency passing circuit coupled to the first and second signal ports between nodes e and f whereby each of said terminals of said configurable terminal block is selectively connectable to said other terminals.

2. The passive component according to claim 1 wherein said first and second low-frequency passing circuits are low-pass filters having predetermined responses determined by various orders.

3. The passive component according to claim 1 wherein said high-frequency passing circuit is a high-pass filter having a predetermined response determined by various orders.

4. The passive component according to claim 1 whereby power insertion or removal may be performed at said current ports.

5. The passive component according to claim 1 further comprising at least one connecting bar coupling at least two of said terminals of said configurable terminal block thereby selectively configuring said terminals of said configurable terminal block allowing said plurality of component configurations.

6. The passive component according to claim 5 wherein said connecting bar couples said first, second, third and fourth terminals of said configurable terminal block.

7. The passive component according to claim 5 wherein one said connecting bar couples said second and fourth terminals of said configurable terminal block and a second said connecting bar couples said first and third terminals of said configurable terminal block.

8. The passive component according to claim 5 wherein one said connecting bar couples said first and fourth terminals of said configurable terminal block and a second said connecting bar couples said third and fourth terminals of said configurable terminal block.

9. The passive component according to claim 5 wherein one said connecting bar couples said first and third terminals of said configurable terminal block.

10. The passive component according to claim 5 wherein one said connecting bar couples said second and fourth terminals of said configurable terminal block.

11. The passive component according to claim 5 wherein one said connecting bar couples said first and third terminals of said configurable terminal block and a second said connecting bar couples said second and fourth terminals of said configurable terminal block.

12. The passive component according to claim 1 further comprising:

a fuse board having first and second fuses and four terminals;

said first fuse is coupled between a first and a second terminal of said fuse board terminals and said second fuse is coupled between a third and a fourth terminal of said fuse board terminals;

said fuse board terminals align with said configurable terminal block allowing precise engagement whereby said first fuse couples said first and third terminals of said configurable terminal block and said second fuse couples said second and fourth terminals of said configurable terminal block.

13. The passive component according to claim 1 further comprising:

a surge suppression board having first and second surge suppression circuits and four terminals;

said first surge suppression circuit is coupled between a first and a second terminal of said suppression board terminals and said second surge suppression circuit is coupled between a third and a fourth terminal of said suppression board terminals;

said suppression board terminals align with said configurable terminal block allowing precise engagement whereby said first surge suppression circuit couples said first and third terminals of said configurable terminal block and said second surge suppression circuit couples said second and fourth terminals of said configurable terminal block.

* * * * *

UNITED STATES PATENT AND TRADEMARK OFFICE
CERTIFICATE OF CORRECTION

PATENT NO. : 6,054,905
DATED : April 25, 2000
INVENTOR(S) : Richard Gresko

It is certified that error appears in the above-indentified patent and that said Letters Patent is hereby corrected as shown below:

At column 1, lines 4-6, delete "This is a division of application Ser. No. 08/604,219, filed Feb. 20, 1996 now U.S. Pat. No. 5,903,046 incorporated herein by reference.".

At column 4, line 56, delete "77" and insert therefor --75--.

At column 4, line 64, delete "75" and insert therefor --77--.

At column 4, line 67, delete "77" and insert therefor --75--.

Signed and Sealed this

Thirteenth Day of March, 2001

Attest:

NICHOLAS P. GODICI

Attesting Officer

Acting Director of the United States Patent and Trademark Office